United States Patent
Pan et al.

(10) Patent No.: US 6,329,233 B1
(45) Date of Patent: Dec. 11, 2001

(54) METHOD OF MANUFACTURING PHOTODIODE CMOS IMAGE SENSOR

(75) Inventors: Jui-Hsiang Pan; Ming-I Chen, both of Hsinchu (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 09/602,469

(22) Filed: Jun. 23, 2000

(51) Int. Cl.[7] .................................. H01L 21/8238
(52) U.S. Cl. ............................... 438/199; 438/275
(58) Field of Search ............................. 438/199, 200, 438/201, 230, 232, 275, 303, 304, 305, 306, 307, 595

(56) References Cited

U.S. PATENT DOCUMENTS

| | | | |
|---|---|---|---|
| 5,786,247 | * | 7/1998 | Chang et al. ........................ 438/231 |
| 6,033,232 | * | 3/2000 | Lin et al. .............................. 438/200 |
| 6,084,259 | * | 7/2000 | Kwon et al. ........................... 257/292 |

\* cited by examiner

*Primary Examiner*—David Nelms
*Assistant Examiner*—David Nhu
(74) *Attorney, Agent, or Firm*—Jiawei Huang; J.C. Patents

(57) ABSTRACT

A method for manufacturing a photodiode CMOS image sensor. A first well and a second well are formed in a first type substrate. An isolation layer is formed over the first well and the second well. At the same time, an isolation layer is formed over another region to pattern out an active region for forming the photodiode. A protective ring layer is formed over the peripheral area of the photodiode active region. A first gate structure and a second gate structure are formed above the first well and the second well respectively. A first type source/drain region and a second type source/drain region are formed in the first well and the second well respectively. Concurrently, a second type heavily doped layer is formed in the first type substrate inside the area enclosed by the protective ring layer. A high-energy ion implantation is carried out to form a second type lightly doped layer in the first type substrate just outside the second type heavily doped layer. The second type lightly doped layer has a thickness much greater than the second type heavily doped layer.

20 Claims, 7 Drawing Sheets

METHOD OF MANUFACTURING PHOTODIODE CMOS IMAGE SENSOR

BACKGROUND OF THE INVENTION

1. Field of the Invention

The present invention relates to a photosensitive device structure. More particularly, the present invention relates to a photodiode CMOS image sensor.

2. Description of the Related Art

Photodiode CMOS image sensors are common image-sensing devices. A typical photodiode CMOS image sensor includes an array of sensing units and some peripheral logic circuits. Each sensing unit further includes a photodiode, a reset transistor and a read-out transistor. The reset transistor and the read-out transistor are mostly N-type MOS transistors while the logic circuits include both N-type and P-type MOS transistors.

In here, a photodiode CMOS image sensor having N-type heavily doped layer and P-type substrate is used an example. The photodiode is controlled by a logic circuit. A voltage is applied to the gate terminal of a reset transistor. Once the reset transistor is switched on by the logic circuit, the $n^+/p$ photodiode junction capacitor is charged up so that the $n^+/p$ photodiode is in reverse bias, thereby forming a large depletion region. When the capacitor is highly charged, the reset transistor is switched off. As light shines on the photosensitive region of the $n^+/p$ photodiode, electron/hole pairs are generated. The electrons and holes are separated by the electric field in the depletion region. Consequently, electrons move towards the N-doped region and lower the electric potential in the N-doped region. Additionally, holes are drained via the P-type substrate.

To measure the photoelectric signals, another transistor is used to transfer the electrons in the N-doped region to a bus line. Thus, charges produced by the light are directly transmitted to the output terminal for reading without having to pass through any amplification devices. This type of photodiode is often referred to as passive pixel photodiode sensor. In contrast, if the N-doped region is connected to a source follower that includes a transfer transistor, the resulting voltage drop in the gate terminal of the transfer transistor can be used to deduce magnitude of the incoming light. Because the current provided by a source follower is usually large, voltage at the output terminal is rather stable and noise is small. This type of photo-sensor is often referred to as active pixel photodiode sensor.

In recent years, low-cost photodiode CMOS image sensors have often been used as a replacement for expensive charge-coupled device (CCD), active pixel photodiode CMOS image sensors. The reason for this is that active photodiode CMOS image sensor has high quantum efficiency, low read-out noise, high dynamic range and random access property. Furthermore, the manufacturing of active photodiode CMOS image sensor is completely compatible with existing CMOS processes. Therefor, other devices such as control circuits, analogue/digital converters and digital signal processors (DSP) can be integrated on the same silicon chip together with the photodiode to form a so-called system-on-chip (SOC).

In general, a conventional photodiode CMOS image sensor includes at least a PMOS transistor, an NMOS transistor and a P/N junction photodiode. FIGS. 1A through 1F are schematic cross-sectional views showing the progression of steps for producing a conventional photodiode CMOS image sensor.

As shown in FIG. 1A, a P-type substrate 100 is provided. An N-well 110 and a P-well 120 are formed in the substrate 100. A field oxide layer 130 is formed over the N-well 110 so that position of the PMOS active region 140 is marked out. At the same time, field oxide layers 132 and 134 are formed over the P-well 120 to mark out the positions of the NMOS active region 142 and the photodiode active region 144. The field oxide layers 130, 132, 134 all have bird's beak structure on their peripheral region. The field oxide layers 130, 132 and 134 are formed, for example, by local oxidation of silicon (LOCOS).

As shown in FIG. 1B, a gate oxide layer 150a and a gate structure 160a are formed over the PMOS active region 140. At the same time, a gate oxide layer 150b and a gate structure 160b are formed over the NMOS active region 142. A P-type lightly doped drain (LDD) region 170 is formed in the N-well 110 on each side of the gate structure 160a. An N-type lightly doped drain (LDD) region 172a is formed in the P-well 120 on each side of the gate structure 160b. Similarly, an N-type LDD region 172b is formed in the P-well 120 within the photodiode active region 144.

As shown in FIG. 1C, deposition and anisotropic etching are carried out in sequence so that spacers 180a and 180b are formed on the sidewalls of the gate structure 160a and the gate structure 160b respectively. Note that the spacers 180a are regarded as part of the gate structure 160a and the spacers 180b are regarded as part of the gate structure 160b in the subsequent description.

As shown in FIG. 1D, a photoresist layer 185 is formed over the NMOS active region 142 and the photodiode active region 144. Using the photoresist layer 185, the gate structure 160a and the field oxide layer 130 as a mask, an ion implant 187 is carried out to implant P-type ions into the N-well 110. Ultimately, P-type source/drain regions 190 are formed on each side of the gate structure 160a, thereby forming a PMOS transistor 140a.

As shown in FIG. 1E, a photoresist layer 195 is formed over the PMOS transistor 140a. Using the photoresist layer 195, the gate structure 160b, the field oxide layers 132 and 134 as a mask, a second ion implant 197 is carried out to implant N-type ions into the P-well 120. Ultimately, N-type source/drain regions 190a are formed on each side of the gate structure 160b, thereby forming an NMOS transistor 1420a. At the same time, an N-type heavily doped regions 192b is also formed within the photodiode active region 144. This N-type heavily doped region 192b and the P-well 120 beneath the region 192b together constitute a photodiode 144a. Finally, the photoresist layer 195 is removed to form the structure shown in FIG. 1F.

However, the photodiode CMOS image sensor manufactured by the aforementioned method has some problems. As shown in FIG. 1F, the edges of the LOCOS field oxide layer 134 that enclose the photodiode 144a has bird's beak. High stress around the bird's beak region produces some lattice dislocation in the neighborhood of the P-well 120 that may lead to current leaks. In addition, the plasma-etching process for forming the gate structures 160a/160b and spacers 180a/180b (in FIGS. 1B and 1C), the ion implantation for forming the N-type LDD region 172a, the common channel stop implantation, the anti-punchthrough ion implantation and the threshold voltage VT adjusting ion implantation all tend to break up the lattice structure. Hence, dislocation in the photodiode active region 144 close to the field oxide layer 134 can be severe. In other words, current leakage is more likely to occur around this area. With a large current leak, read-out noise of the photodiode CMOS image sensor will increase and image quality will deteriorate.

Moreover, there is an additional problem regarding the aforementioned manufacturing method. Since the NMOS transistor 142a and the photodiode 144a are both on the P-well 120, doping concentration in the P-well 120 must be high for the NMOS transistor 142a to operate normally. Consequently, the junction depletion region between the N-type heavily doped region 192b of the photodiode 144a and the P-well 120 shrinks. Hence, there is a lowering of quantum efficiency of the photodiode 144a (the capacity for transforming optical energy into electrical energy). In other words, the contrast ratio of the photodiode 144a is lower and quality of the image is poor.

SUMMARY OF THE INVENTION

Accordingly, one objective of the present invention is to provide a photodiode CMOS image sensor having low noise signal and high contrast ratio. The photodiode is formed on a first type substrate. The photodiode is formed in the substrate instead of a doped well. Furthermore, the peripheral region of the photodiode is protected against the damaging effect during various processes.

To achieve these and other advantages and in accordance with the purpose of the invention, as embodied and broadly described herein, the invention provides a method of manufacturing a photodiode CMOS image sensor. A first type well and a second type well are formed in the first type substrate. A plurality of isolation layers are formed over the first type well, the second type well and the first type substrate. Ultimately, an active region for forming a second type MOS transistor, an active region for forming a first type MOS transistor and an active region for forming a photodiode are defined. A protective ring layer is formed around the periphery of the active region for forming the photodiode. A first gate structure is formed on the active region for forming the second type MOS transistor. Meanwhile, a second gate structure is also formed on the active region for forming the first type MOS transistor. First type source/drain regions are formed in the second type well on each side of the second gate structure, thereby forming the first type MOS transistor. Second type source drain regions are formed in the first type well on each side of the first gate structure, thereby forming the second type MOS transistor. At the same time, a second type heavily doped layer is also formed in the first type substrate inside the protective ring layer. A high-energy ion implant is carried out to form a second type lightly doped layer in the first type substrate just outside the second type heavily doped layer. Thickness of the second type lightly doped layer is much greater than the second type heavily doped layer. The first type substrate can be an N-type substrate or a P-type substrate. The isolation layer can be a field oxide layer formed by local oxidation of silicon (LOCOS). The protective ring layer can be, for example, a silicon oxide layer formed by thermal oxidation.

In addition, channel stop ion implantation and anti-punchthrough ion implantation can be incorporated into the process of manufacturing photodiode CMOS image sensor. If the second doped well is an N-well and the first type well is a P-well, an N-type channel stop ion implantation can be carried out concurrently with the forming of the N-type well. Hence, an N-type channel stop is formed within the N-well. After the formation of the P-type well and the isolation layer over the P-type well, a P-type channel stop ion implantation can be carried out so that a P-type channel stop layer is formed beneath the isolation layer. Moreover, a P-type anti-punchthrough ion implantation can be carried out to form a P-type anti-punchthrough layer within the P-well. The P-type anti-punchthrough layer has a thickness smaller than the P-type channel stop layer.

A threshold voltage adjusting ion implantation can also be incorporated into the process of manufacturing the photodiode CMOS image sensor. Threshold voltage adjustment is carried out while the protective ring layer is formed. The method includes the steps of forming a protective layer over the first type substrate, and then forming a first photoresist ring layer over the protective layer around the periphery of the photodiode active region. Using the first photoresist ring layer as a mask, a threshold voltage adjustment implantation is carried out by implanting ions into the first type substrate. The exposed protective layer that lies outside the first photoresist ring layer is removed to form the protective ring layer.

The first type source/drain regions, the second type source/drain regions and the second type heavily doped layer can be formed as follows. Second type lightly doped drain (LDD) layers are formed in the first type well on each side of the first gate structure. Similarly, first type LDD layers are formed in the second type well on each side of the second gate structure. A conformal dielectric layer is formed over the first type substrate, and then a second photoresist ring layer is formed over the dielectric layer above the protective ring layer. Using the second photoresist ring layer as a mask, anisotropic etching is used to remove a portion of the dielectric layer so that a dielectric ring layer is formed over the protective ring layer. Concurrently, spacers are also formed on the sidewalls of the first and the second gate structure. Subsequently, an ion implantation is carried out to form first type source/drain regions in the second type well on each side of the spacer-protected second gate structure and second type source/drain regions in the first type well on each side of the spacer-protected first gate structure. At the same time, a second type heavily doped layer is formed in the first type substrate inside the dielectric ring layer, wherein the dielectric ring layer serves as a mask in the ion implantation.

This invention also provides a photodiode CMOS image sensor. The photodiode includes a first type substrate, a second type heavily doped layer, a second type lightly doped layer, a protective ring layer, a dielectric ring layer and an isolation layer. The second type heavily doped layer is formed in the first type substrate. The second type heavily doped layer has a dopant concentration much greater than the first type substrate. The second type lightly doped layer is formed in the first type substrate outside the second type heavily doped layer. Thickness of the second type lightly doped layer is much greater than the second type heavily doped layer. The protective ring layer is formed above the second type lightly doped layer and the dielectric ring layer is formed above the protective ring layer. The isolation layer is formed around the peripheral regions of the second type light doped layer.

The photodiode CMOS image sensor formed by the method of this invention has smaller current leaks and read-out noise due to lattice dislocation even if the isolation layer is a field oxide layer having bird's beak edges. Bird's beak dislocation in the photodiode region close to the field oxide layer will be reduced due to the following reasons. First, the protective ring layer serves as a mask around the peripheral active region of the photodiode when the gate structure is formed. Second, ions in the P-type channel stop implantation and the P-type anti-punchthrough implantation are restricted to the P-well only. Since the photodiode active region is shielded, damage to the lattice structure near the peripheral region of the photodiode active region are prevented. Third, the first photoresist ring layer above the peripheral region of the photodiode serves as a mask in the threshold voltage implantation. Hence, lattice structure around the active region of the photodiode is protected. Fourth, the protective ring layer above the peripheral region of the photodiode serves as a mask in the ion implantation for forming the second type lightly doped drain layer. Hence, lattice structure around the active region of the photodiode is protected. Fifth, the second photoresist ring layer above the peripheral region of the photodiode serves as a mask in the anisotropic etching operation for producing the spacers. Again, plasma-etching ions are prevented from damaging the lattice structure around the peripheral region of the photodiode. In brief, the peripheral region of the photodiode is protected from damage by ions throughout each step in the manufacturing process.

In addition, the second type heavily doped layer and the bird's beak portion of the field oxide layer are separated by the second type lightly doped layer. With the second type heavily doped layer further away from the easy leak portion, current leak from the photodiode is smaller. In other words, read-out noise is greatly reduced. Moreover, the photodiode structure is formed in the first type substrate. The dopant concentration of the first type substrate is far lower than the dopant concentration in the first type well. Therefore, the junction depletion region of the photodiode can expand so that quantum efficiency resulting from the conversion of optical to electrical energy is higher. In other words, the contrast ratio of the photodiode is increased. Because the photodiode CMOS image sensor of this invention has a smaller read-out noise and a larger contrast ratio, image-reception quality is better.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1A:
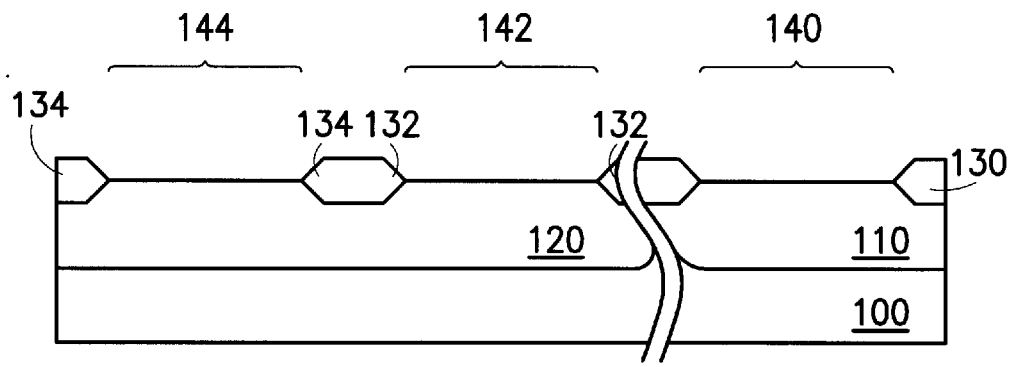
FIGS. 1A through 1F are schematic cross-sectional views showing the progression of steps for producing a conventional photodiode CMOS image sensor.
Figure 1B:
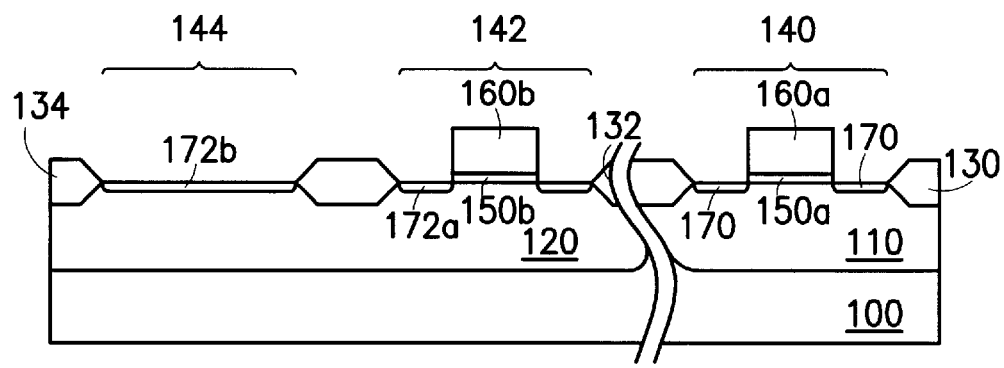
Figure 1C:
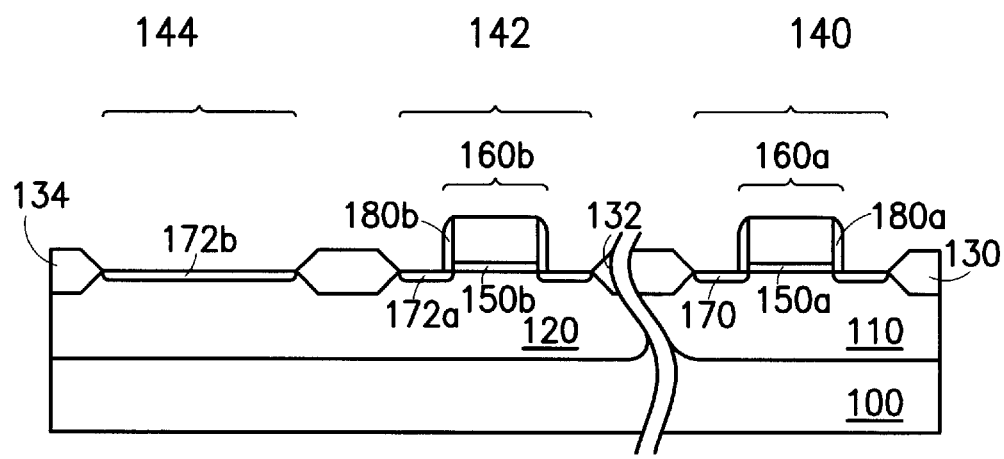
Figure 1D:
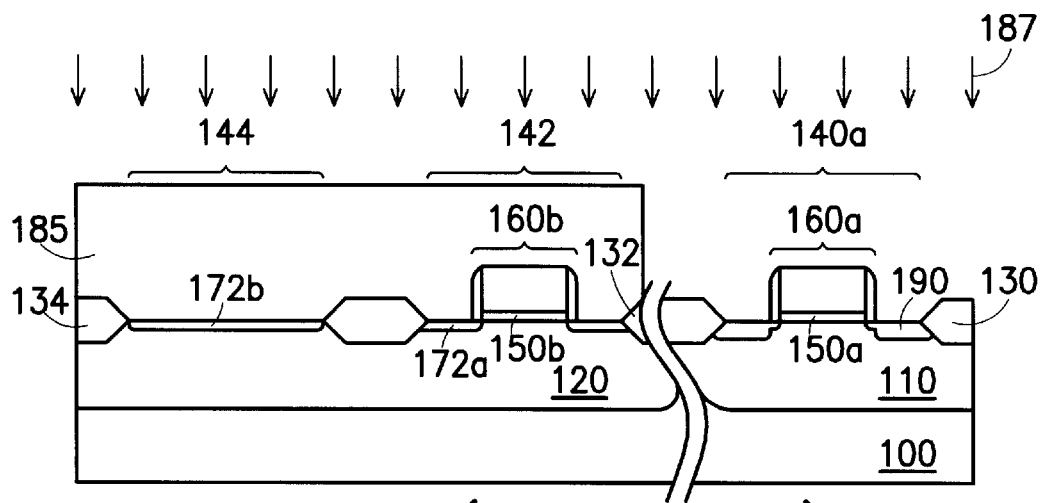
Figure 1E:
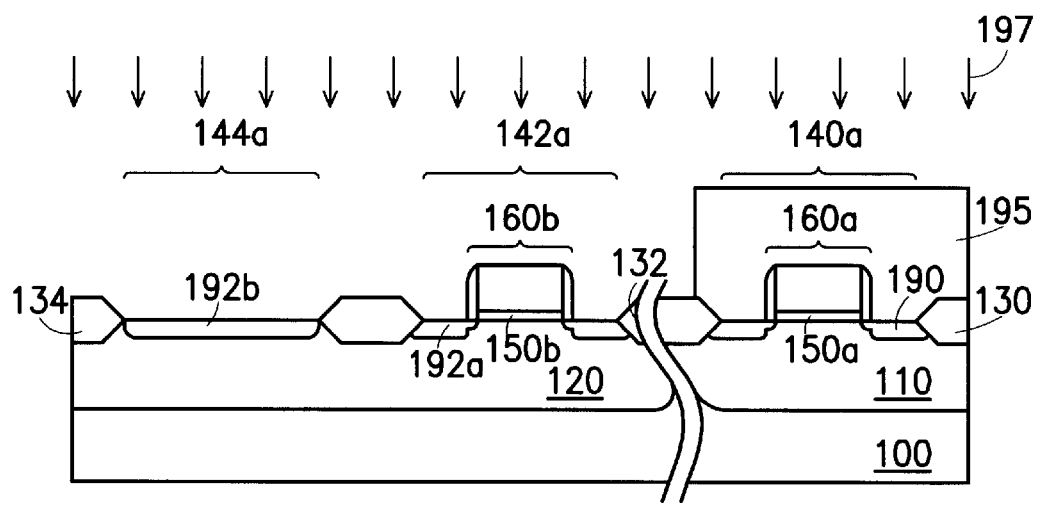
Figure 1F:
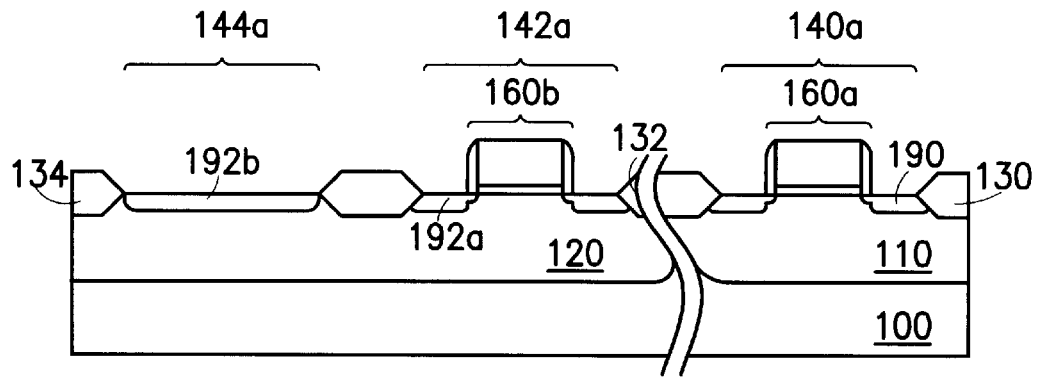

Reference will now be made in detail to the present preferred embodiments of the invention, examples of which are illustrated in the accompanying drawings. Wherever possible, the same reference numbers are used in the drawings and the description to refer to the same or like parts.

Figure 2A:
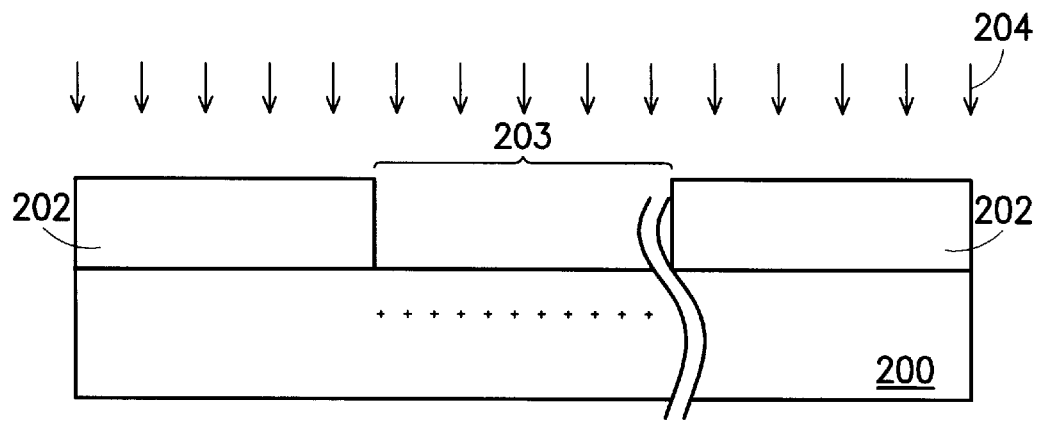
FIGS. 2A through 2N are schematic cross-sectional views showing the progression of steps for manufacturing a photodiode CMOS image sensor according to one preferred embodiment of this invention.

In the embodiment of this invention, a P-type substrate and $n^+/p$ photodiode are used for the purpose of illustration. However, the method can be equally applied to the manufacturing of $p^+/n$ type photodiode. FIGS. 2A through 2N are schematic cross-sectional views showing the progression of steps for manufacturing a photodiode CMOS image sensor according to one preferred embodiment of this invention.

As shown in FIG. 2A, a patterned photoresist layer 202 is formed over a P-type substrate 200. The photoresist layer 202 exposes the desired P-well 203. An ion implantation 204 is carried out to implant P-type ions into the desired P-well 203 of the P-type substrate 200. The P-type ions can be boron ions, for example.

Figure 2B:
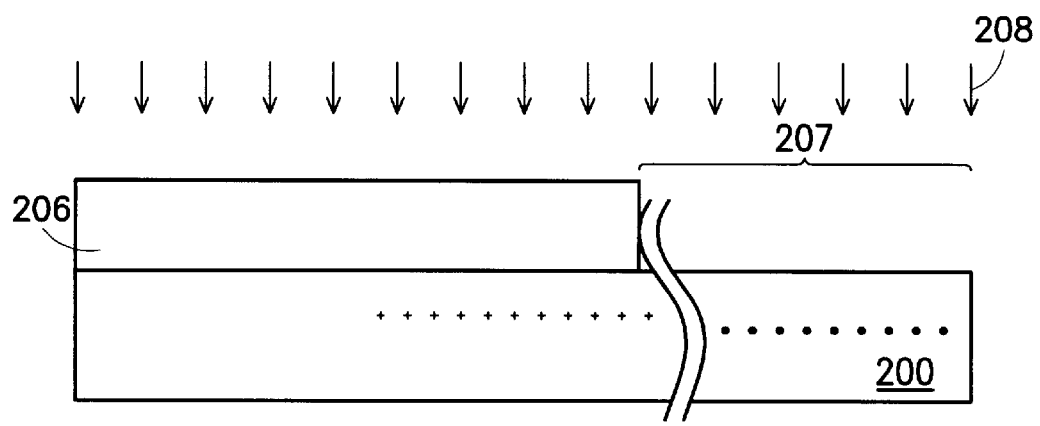

As shown in FIG. 2B, the photoresist layer 202 is removed. Another patterned photoresist layer 206 is formed over the P-type substrate 200. The photoresist layer 206 exposes the desired N-well 207. An ion implantation 208 is carried out to implant N-type ions into the desired N-well 207 of the P-type substrate 200. The N-type ions can be phosphorus ions, for example.

Figure 2C:
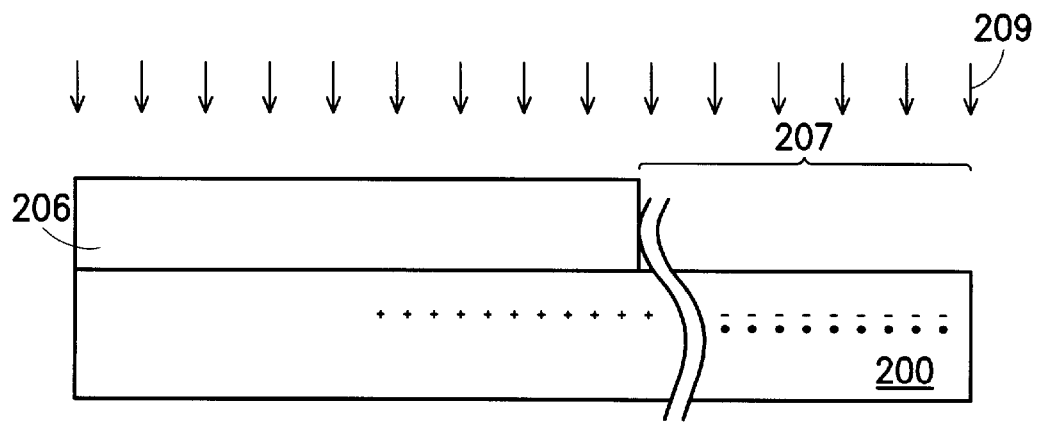

As shown in FIG. 2C, a channel stop ion implantation 209 is carried out to implant N-type ions into the P-type substrate 200 within the N-well 207. The N-type ions can be arsenic ions, for example. Depth of ion implantation 209 is smaller than depth of the ion implantation 208.

Figure 2D:
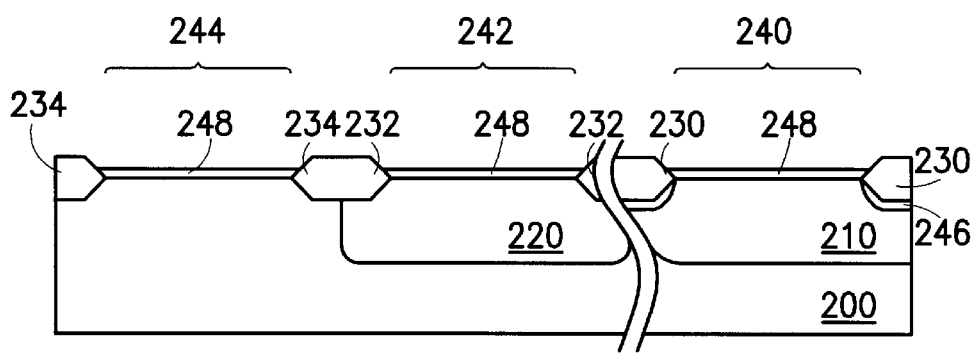

As shown in FIG. 2D, the photoresist layer 206 is removed. An annealing operation is carried out so that an N-well 210 and a P-well 220 are formed in the P-type substrate 200. Field oxide layers 230, 232 and 234 are formed over the N-well 210, the P-well 220 and the P-type substrate 200 respectively. Consequently, an active region 240 for forming a PMOS transistor, an active region 242 for forming an NMOS transistor and an active region 244 for forming a photodiode are formed. The field oxide layers 230, 232 and 234 are formed by a local oxidation of silicon (LOCOS), and hence all of them have bird's beak structure. Due to the heat in the LOCOS operation, the N-type ions implanted into the N-well 210 during the channel stop implantation 209 diffuse to form an N-type channel stop region 246 under the field oxide layer 230. A sacrificial oxide layer 248 is formed over the N-well 210, the P-well 220 and the P-type substrate 200. The sacrificial oxide layer 248 preferably has a thickness of about 300 Å.

Figure 2E:
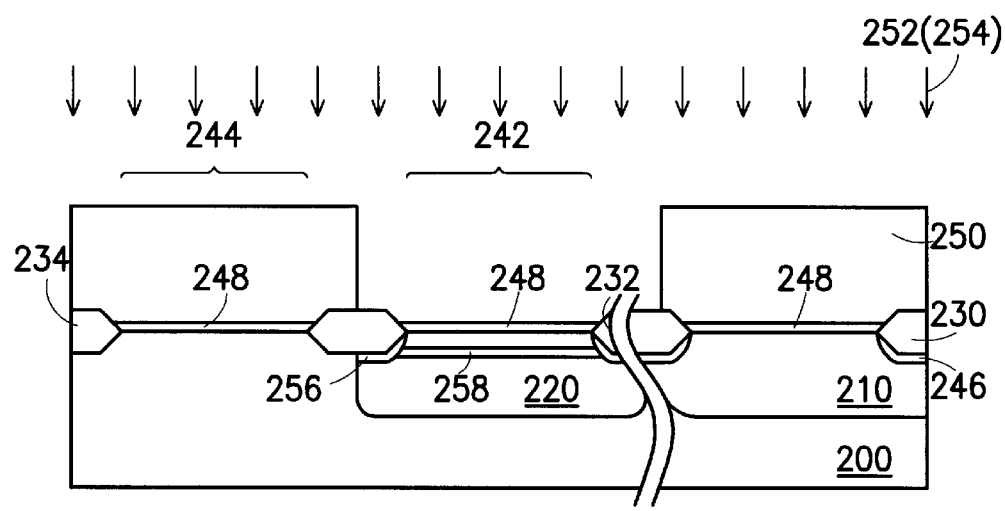

As shown in FIG. 2E, a patterned photoresist layer 250 is formed over the P-type substrate 200. The photoresist layer 250 exposes the active region 242 for forming the NMOS transistor. A P-type channel stop implantation 252 and a P-type anti-punchthrough implantation 254 are carried out to form a P-type channel stop region 256 and a P-type anti-punchthrough region 258 inside the P-well 220. The P-type channel stop implantation 252 is conducted using, for example, boron ions accelerated to an energy level greater than 180 KeV. The P-type anti-punchthrough implantation is conducted using, for example, boron ions accelerated to an energy level less than or equal to 80 KeV. Since the ions in the channel stop implantation 252 and the anti-punchthrough implantation 254 are channeled to the P-well 220, damages to the lattice structure around the active region 244 of the photodiode and the resulting expansion of bird's beak dislocations are prevented.

Figure 2F:
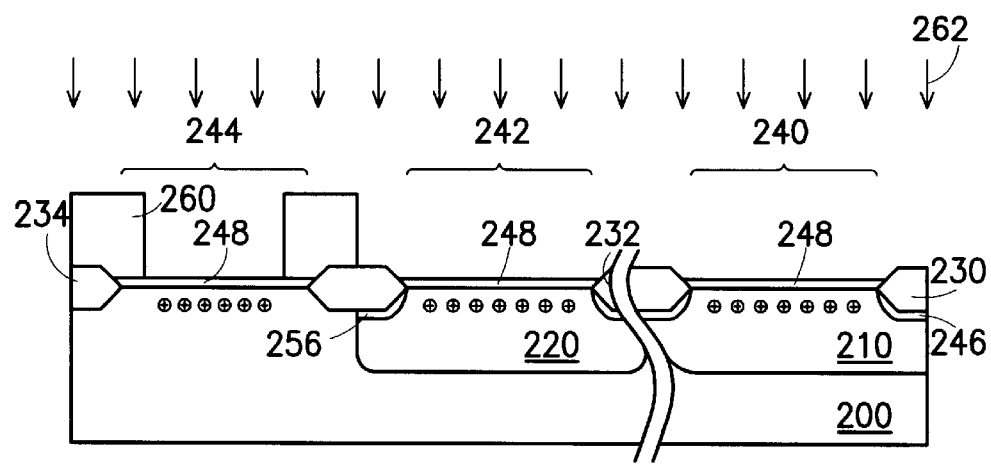

As shown in FIG. 2F, the photoresist layer 250 is removed. A photoresist ring layer 260 is formed over the sacrificial oxide layer 248 above the peripheral area of the photodiode active region 244 and a portion of the field oxide layer 234. Using the photoresist ring layer 260 as a mask, a P-type threshold voltage adjustment implantation 262 is carried out to implant P-type ions into the PMOS active region 240, the NMOS active region 242 and the central portion of the photodiode active region 244. The threshold voltage implantation 262 is conducted using, for example, $BF_2^+$ ions accelerated to an energy level of about 60 KeV. Since the peripheral area of the photodiode active region 244 is covered by the photoresist ring layer 260, damages to the lattice structure by ions during the threshold voltage implantation 262 and the consequent expansion of bird's beak dislocations are prevented.

Figure 2G:
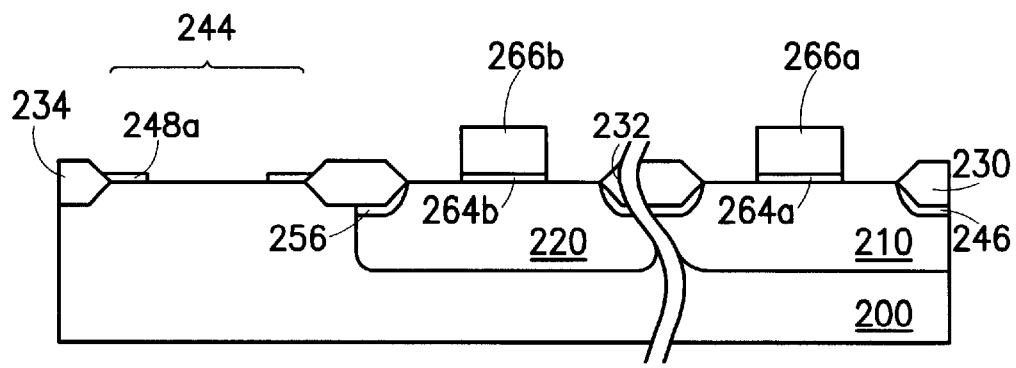

As shown in FIG. 2G, the sacrificial oxide layer 248 outside the photoresist ring layer 260 is removed to form a protective ring layer 248a. The photoresist ring layer 260 is removed. A gate oxide layer 264a and a gate structure 266a are formed over the N-well 210 while a gate oxide layer 264b and a gate structure 266b are formed over the P-well 220. The peripheral area of the photodiode active region 244 is protected by the protective ring layer 248a when the gate oxide layers 264a(b) and the gate structures 266a(b) are formed. Thus, damage to the lattice structure due to plasma-etching ions and the consequent expansion of bird's beak dislocations are prevented.

Figure 2H:
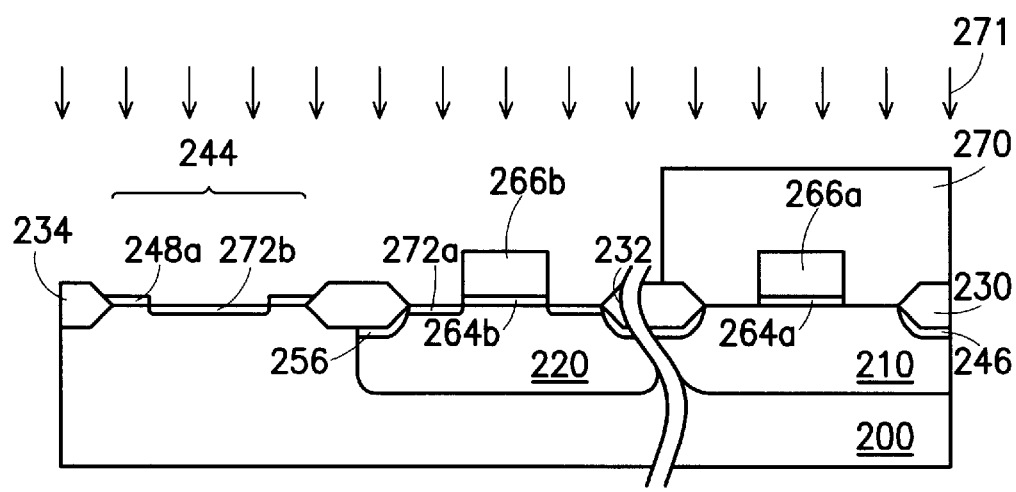
Figure 2I:
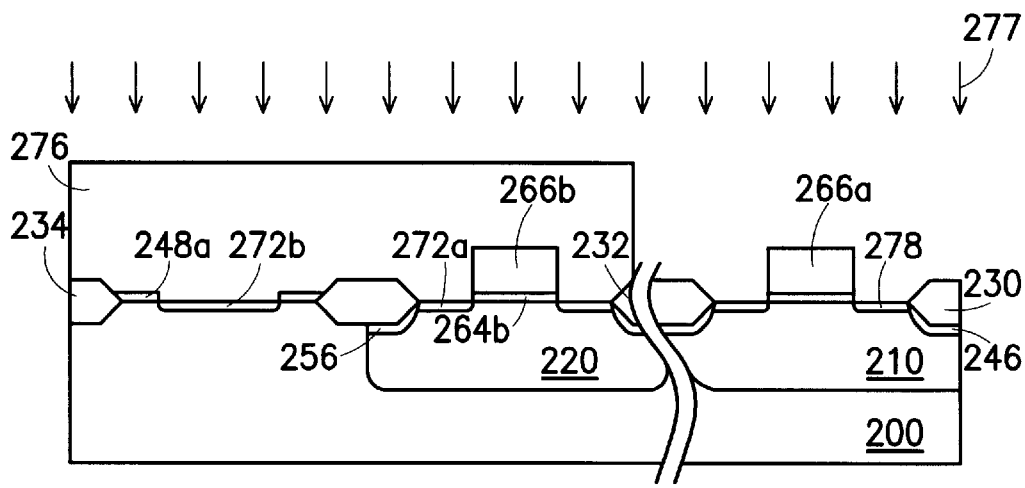

As shown in FIG. 2H, a patterned photoresist layer 270 is formed over the P-type substrate 200. The photoresist layer 270 covers the N-well 210. Using the field oxide layers 232 and 234, the photoresist layer 270, the gate structure 266b and the protective ring layer 248a as a mask, an N-type ion implantation 271 is carried out. The N-type ion implantation 271 is conducted using, for example, phosphorus ions accelerated to an energy level less than or equal to 60 KeV. Consequently, an N-type lightly doped drain (LDD) layer 272a is formed in the P-well 220 on each side of the gate structure 266b. At the same time, an N-type lightly doped drain layer 272b is formed in the P-type substrate 200 within the protective ring layer 248a. Since the peripheral area of the photodiode active region 244 is protected by the protective ring layer 248a, damage to the lattice structure due to ions and the consequent expansion of bird's beak dislocations are prevented. As shown in FIG. 2I, the photoresist layer 270 is removed. Another patterned photoresist layer 2776 is formed over the P-type substrate 200. The photoresist layer 276 exposes the N-well 210. Using the field oxide layer 230, the photoresist layer 276 and the gate structure 266a as a mask, a P-type ion implantation 277 is carried out. The ion implantation 277 is conducted using, for example, $BF_2^+$ ion accelerated to an energy level less than or equal to 60 KeV. Ultimately, a P-type lightly doped drain (LDD) layer 278 is formed in the N-well 210 on each side of the gate structure 266a.

Figure 2J:
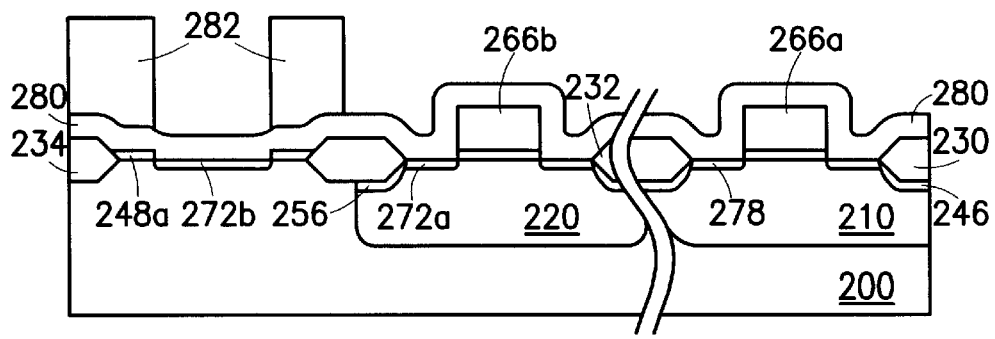

As shown in FIG. 2J, the photoresist layer 276 is removed. A conformal dielectric layer 280 is formed over the P-type substrate 200. A photolithographic process is used to form a photoresist ring layer 282 over the protective ring layer 248a and a portion of the dielectric layer 280a above the field oxide layer 234. The dielectric layer 280 can be a silicon oxide layer formed, for example, by atmospheric pressure chemical vapor deposition (APCVD).

Figure 2K:
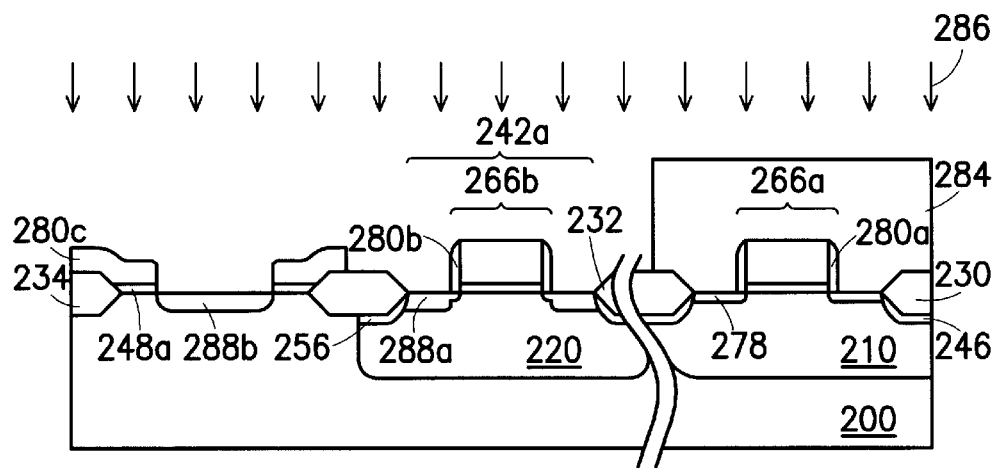

As shown in FIG. 2K, an anisotropic etching operation is carried out to remove a portion of the dielectric layer 280 to form a dielectric ring layer 280c over the protective 15 ring layer 248a and a portion of the field oxide layer 234. At the same time, spacers 280a are formed on the sidewalls of the gate structure 266a and spacers 280b are formed on the sidewalls of the gate structure 266b. Since the dielectric layer 280 above the peripheral area of the photodiode active region 244 is covered by the photoresist ring layer 282, this portion of the dielectric layer 280 remains. Hence, damage to the lattice structure by ions and consequent expansion of bird's beak dislocations are prevented.

Note that the spacers 280a are regarded as part of the gate structure 266a while the spacers 280b are regarded as part of the gate structure 266b in the following description.

As shown in FIG. 2K, the photoresist ring layer 282 is removed. A patterned photoresist layer 284 is formed over the N-well 210. Using the photoresist layer 284, the gate structure 266b, the dielectric ring layer 280c and the field oxide layers 232 and 234 as a mask, an N-type ion implantation 286 is carried out to form an N-type heavily doped layer 288b in the P-type substrate 200 within the dielectric ring layer 280c. At the same time, N-type source/drain regions 288a are formed in the P-well 220 on each side of the gate structure 266b. Thus, an NMOS transistor 242a is formed. The N-type ion implantation 286 can be conducted, for example, using arsenic ions accelerated to an energy level less than or equal to 80 KeV. The N-type source/drain regions 288a and the N-type heavily doped layer 288b preferably have a dopant concentration of about $10^5/cm^3$.

Figure 2L:
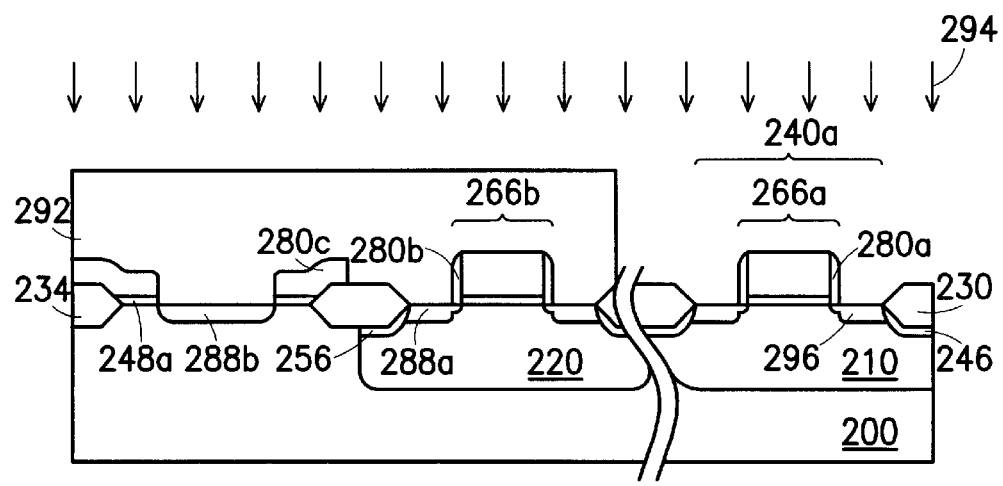

As shown in FIG. 2L, the photoresist layer 284 is removed. Another patterned photoresist layer 292 is formed over the P-type substrate 200. The photoresist layer 292 exposes the N-well 210. Using the photoresist layer 292, the gate structure 266a and the field oxide layer 230 as a mask, a P-type ion implantation 294 is carried out to form P-type source/drain regions 296 in the N-well 210 on each side of the gate structure 266a. Thus, a PMOS transistor 240a is formed. The P-type ion implantation 294 can be conducted using, for example, $BF_2+$ ions accelerated to an energy level less than or equal to 60 KeV.

Figure 2M:
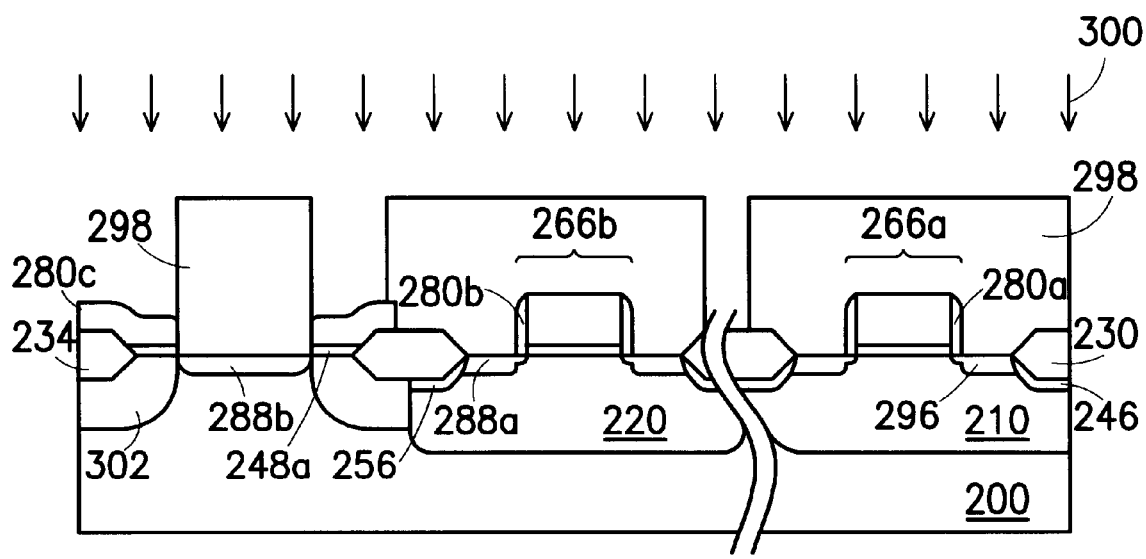
Figure 2N:
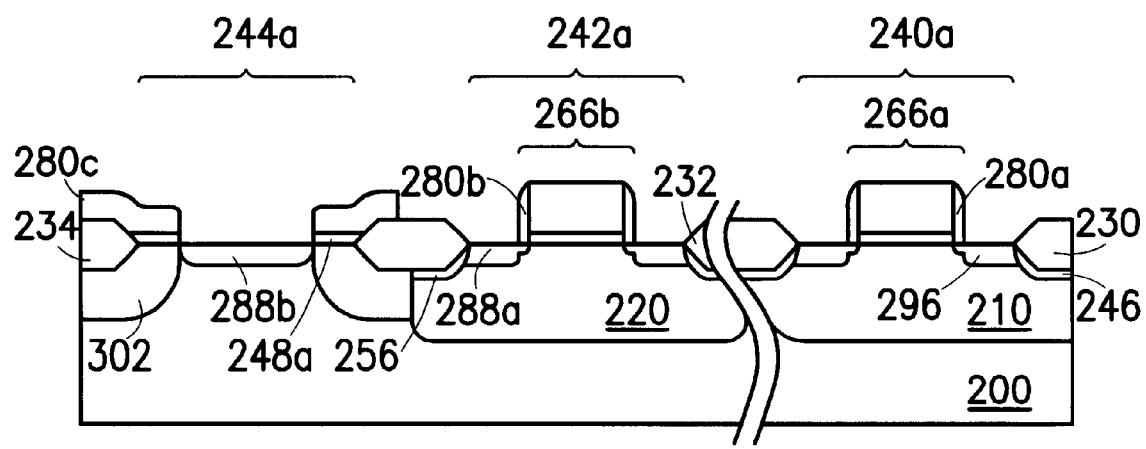

As shown in FIG. 2M, a patterned photoresist layer 298 is formed over the P-type substrate 200. The photoresist layer 298 exposes the dielectric ring layer 280c. Using the photoresist layer 298 as a mask, a high-energy N-type ion implantation 300 is carried out to form an N-type lightly doped layer 302 in the P-type substrate 200 ringing around the N-type heavily doped layer 288b. Thus, the photodiode 244a of this invention is formed. The high-energy N-type ion implantation 300 can be conducted using, for example, phosphorous ions accelerated to an energy level of greater than 240 KeV. The N-type lightly doped layer 302 preferably has a dopant concentration of between $5 \times 10^{12}/cm^3$ to $5 \times 10^3/cm^3$.

As shown in FIG. 2N, the photoresist layer 298 is removed to obtain the photodiode CMOS image sensor of this invention. The photodiode 244a includes the P-type substrate 200, the N-type heavily doped layer 288b, the N-type lightly doped layer 302, the dielectric ring layer 280c, the protective ring layer 248a and the field oxide layer 234. The N-type heavily doped layer 288b is formed in the P-type substrate 200 with the N-type heavily doped layer 288b having a dopant concentration much higher than the P-type substrate 200. The N-type lightly doped layer 302 is formed in the P-type substrate 200 just outside the N-type heavily doped layer 288b with thickness of the N-type lightly doped layer 302 far greater than the N-type heavily doped layer 288b. The protective ring layer 248a is formed above the N-type lightly doped layer 302. The dielectric ring layer 200c is formed above the protective ring layer 248a. The field oxide layer 234 is formed above the peripheral area of the N-type lightly doped layer 302.

In the process of fabrication the photodiode CMOS image sensor of this invention, bird's beak dislocations of the photodiode 244a in area close to the field oxide layer 234 are largely prevented and hence current leakage is greatly reduced. In other words, read-out noises of the photodiode image sensor are lowered considerably.

The prevention of bird's beak dislocations can be attributed to the following procedures.

In FIG. 2E, since the ions in the channel stop implantation 252 and the anti-punchthrough implantation 254 are channeled to the P-well 220, damages to the lattice structure around the peripheral area of the photodiode active region 244 are prevented.

In FIG. 2F, since the peripheral area of the photodiode active region 244 is covered by the photoresist ring layer 260, damage to the lattice structure due to the ions in the threshold voltage implantation 262 is prevented.

In FIG. 2G, since the peripheral area of the photodiode active region 244 is covered by the protective ring layer 248a when the gate oxide layers 264a(b) and the gate structures 266a(b) are formed, damage to the lattice structure due to plasma-etching ions is prevented.

In FIG. 2H, the peripheral area of the photodiode active region 244 is covered by the protective ring layer 248a, damage to the lattice structure by ions resulting from N-type ion implantation 271 and subsequent formation of the N-type LDD region 272a are prevented.

In FIGS. 2J and 2K, since the dielectric layer above the peripheral area of the photodiode active region 244 is protected by the photoresist ring layer 282 when the anisotropic etching operation to form the spacers 280a(b) is carried out, this portion of the dielectric layer 280 is retained. Hence, damage to the lattice structure due to plasma-etching ions is prevented.

The N-type heavily doped layer 288b and the bird's beak region of the field oxide layer 234 are separated by an N-type lightly doped layer 302, as shown in FIG. 2N.

Hence, the N-type heavily doped layer 288b is at a distance from the most vulnerable leak area so that the chance of a current leak is more remote. Additionally, the photodiode 244a is formed in the P-type substrate 200. The dopant concentration of the P-type substrate 200 is far lower than the P-well 220. Hence, thickness of the junction depletion region is able to increase considerably leading to a higher quantum efficiency of optical to electrical energy conversion and a higher contrast ratio for the photodiode 244a. Since the photodiode CMOS image sensor of this invention has smaller read-out signal noises and a larger contrast ratio, reception quality improves.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method for manufacturing a photodiode CMOS image sensor, comprising the steps of:
   providing a first type substrate;
   forming a first type well and a second type well in the first type substrate;
   forming a plurality of isolation layers over the first type well, the second type well and the first type substrate so that an active region for forming a second type MOS transistor, an active region for forming a first type MOS transistor and an active region for forming a photodiode are patterned out;
   forming a protective ring layer on the peripheral area of the active region for forming the photodiode;
   forming a first gate structure over the active region for forming the first type MOS transistor and a second gate structure over the active region for forming the second type MOS transistor;
   forming a second type source/drain region in the first type well on each side of the first gate structure and a second type heavily doped layer in the first type substrate enclosed by the protective ring layer;
   forming a first type source/drain region in the second type well on each side of the second gate structure; and
   conducting a high-energy ion implantation to form a second type lightly doped layer ringing around the second type heavily doped layer in the first type substrate, wherein thickness of the second type lightly doped layer is much greater than the second type heavily doped layer.

2. The method of claim 1, wherein the first type substrate can be an N-type substrate or a P-type substrate.

3. The method of claim 1, wherein the step of forming isolation layers includes carrying out local oxidation of silicon (LOCOS) operation to form a plurality of field oxide layer.

4. The method of claim 1, wherein the second type well includes an N-type well, and the step of forming the N-type well further includes carrying out an N-type channel stop implantation.

5. The method of claim 1, wherein the first type well includes a P-type well, and the step of forming the P-type well after the step of forming the isolation layers includes:
   conducting a P-type channel stop implantation to form a P-type channel stop layer in the P-type well underneath the isolation layers;
   conducting a P-type anti-punchthrough implantation to form a P-type anti-punchthrough layer in the P-type well, wherein the P-type anti-punchthrough layer has a thickness smaller than the P-type channel stop layer.

6. The method of claim 5, wherein the step of performing the P-type channel stop implantation includes accelerating boron ions to an energy level greater than 180 KeV.

7. The method of claim 5, wherein the step of performing the P-type anti-punchthrough implantation includes accelerating boron ions to an energy level less than or equal to 80 KeV.

8. The method of claim 1, wherein the step of forming the protective ring layer includes the substeps of:
   forming a protective layer over the first type substrate;
   forming a first photoresist ring layer over the protective layer above the peripheral area of the photodiode active region; and
   removing the protective layer outside the first photoresist ring layer.

9. The method of claim 8, wherein after the step of forming the photoresist ring layer, further includes conducting a threshold voltage adjusting implantation using the first photoresist ring layer as a mask.

10. The method of claim 9, wherein the step of performing the threshold voltage implantation includes accelerating $BF_2^+$ ions to an energy level of about 60 KeV.

11. The method of claim 1, wherein the step of forming the protective ring layer includes conducting a thermal oxidation operation to form a sacrificial oxide layer.

12. The method of claim 11, wherein the sacrificial oxide layer has a thickness of about 300 Å.

13. The method of claim 1, wherein the second type lightly doped layer includes an N-doped region and the high-energy implantation includes implanting phosphorus ions by accelerating the ions to an energy level greater than 240 KeV.

14. The method of claim 1, wherein dopant concentration of the second type lightly doped layer is between about $5 \times 10^{12}/cm^3$ to $5 \times 10^{13}/cm^3$.

15. The method of claim 1, wherein the steps for forming the first type source/drain region, the second type source/drain region and the second type heavily doped layer includes:

forming a second type lightly doped drain (LDD) layer in the first type well on each side of the first gate structure;

forming a first type lightly doped drain (LDD) layer in the second type well on each side of the second gate structure;

forming a conformal dielectric layer over the first type substrate;

forming a patterned second photoresist ring layer over a dielectric layer lying above the protective ring layer;

removing a portion of the dielectric layer by performing an anisotropic etching operation using the second photoresist ring layer as a mask so that a dielectric ring layer is formed over the protective ring layer, meanwhile, spacers are formed on the sidewalls of the first gate structure and the second gate structure;

forming a second type source/drain region in the first type well on each side of the spacer-bound first gate structure and a second type heavily doped layer in the first type substrate inside a dielectric ring layer enclosed area, wherein the dielectric ring layer serves as an ion implantation mask; and forming a first type source/drain region in the second well on each side of a spacer-bounded second gate structure.

16. The method of claim 15, wherein the step of forming the dielectric layer includes depositing silicon oxide in an atmospheric pressure chemical vapor deposition.

17. The method of claim 15, wherein the first type lightly doped drain layer includes a P-type lightly doped region and the step of forming the P-type lightly doped region includes implanting $BF_2^{30}$ ions by accelerating the ions to an energy level less than or equal to 60 KeV.

18. The method of claim 15, wherein the second type lightly doped drain layer includes an N-type lightly doped region and the step of forming the N-type lightly doped region includes implanting phosphorus ions by accelerating the ions to an energy level less than or equal to 60 KeV.

19. The method of claim 15, wherein the second type source/drain region includes an N-type source/drain region and the step of forming the N-type source/drain region includes implanting arsenic ions by accelerating the ions to an energy level less than or equal to 80 KeV.

20. The method of claim 15, wherein the first type source/drain region includes a P-type source/drain region and the step of forming the P-type source/drain region includes implanting $BF_2^+$ ions by accelerating the ions to an energy level less than or equal to 60 KeV.

* * * * *